(12) United States Patent
Chuang et al.

(10) Patent No.: US 11,855,025 B2
(45) Date of Patent: Dec. 26, 2023

(54) SEMICONDUCTOR DEVICE AND PACKAGE ASSEMBLY INCLUDING THE SAME

(71) Applicant: TAIWAN SEMICONDUCTOR MANUFACTURING COMPANY, LTD., Hsinchu (TW)

(72) Inventors: Chita Chuang, Kaohsiung (TW);
Yao-Chun Chuang, Taipei (TW);
Tsung-Shu Lin, Yonghe (TW);
Chen-Cheng Kuo, Chu-Pei (TW);
Chen-Shien Chen, Zhubei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 736 days.

(21) Appl. No.: 16/687,089

(22) Filed: Nov. 18, 2019

(65) Prior Publication Data

US 2020/0098712 A1   Mar. 26, 2020

Related U.S. Application Data

(60) Continuation of application No. 15/904,812, filed on Feb. 26, 2018, now Pat. No. 10,483,225, which is a
(Continued)

(51) Int. Cl.
*H01L 23/00* (2006.01)
*H01L 23/31* (2006.01)

(52) U.S. Cl.
CPC .............. *H01L 24/11* (2013.01); *H01L 24/03* (2013.01); *H01L 24/05* (2013.01); *H01L 24/13* (2013.01); *H01L 23/3192* (2013.01); *H01L 24/16* (2013.01); *H01L 2224/0345* (2013.01); *H01L 2224/0361* (2013.01); *H01L 2224/03912* (2013.01); *H01L 2224/0401* (2013.01); *H01L 2224/05005* (2013.01); *H01L 2224/05022* (2013.01); *H01L 2224/05124* (2013.01); *H01L 2224/05139* (2013.01); *H01L 2224/05147* (2013.01); *H01L 2224/05166* (2013.01); *H01L 2224/05181* (2013.01); *H01L 2224/05186* (2013.01);
(Continued)

(58) Field of Classification Search
CPC ................................ H01L 23/00; H01L 24/00
See application file for complete search history.

(56) References Cited

U.S. PATENT DOCUMENTS

2007/0166993 A1   7/2007   Lee et al.
2009/0079094 A1   3/2009   Lin
(Continued)

FOREIGN PATENT DOCUMENTS

CN         101617396       12/2009

*Primary Examiner* — Marvin Payen
(74) *Attorney, Agent, or Firm* — Hauptman Ham, LLP (57) ABSTRACT

A semiconductor device includes a conductive pad having a first width. The semiconductor device includes a passivation layer over the conductive pad, wherein the passivation layer directly contacts the conductive pad. The semiconductor device includes a protective layer over the passivation layer, wherein the protective layer directly contacts the conductive pad. The semiconductor device includes an under-bump metallization (UBM) layer directly contacting the conductive pad, wherein the UBM layer has a second width greater than the first width. The semiconductor device includes a conductive pillar on the UBM layer.

20 Claims, 6 Drawing Sheets

Related U.S. Application Data division of application No. 13/193,969, filed on Jul. 29, 2011, now Pat. No. 9,905,524.

(52) U.S. Cl.
CPC .............. *H01L 2224/05541* (2013.01); *H01L 2224/05552* (2013.01); *H01L 2224/05562* (2013.01); *H01L 2224/05572* (2013.01); *H01L 2224/05647* (2013.01); *H01L 2224/1145* (2013.01); *H01L 2224/1147* (2013.01); *H01L 2224/11462* (2013.01); *H01L 2224/11464* (2013.01); *H01L 2224/13005* (2013.01); *H01L 2224/1308* (2013.01); *H01L 2224/13022* (2013.01); *H01L 2224/13083* (2013.01); *H01L 2224/13109* (2013.01); *H01L 2224/13111* (2013.01); *H01L 2224/13139* (2013.01); *H01L 2224/13144* (2013.01); *H01L 2224/13147* (2013.01); *H01L 2224/13155* (2013.01); *H01L 2224/13164* (2013.01); *H01L 2224/13169* (2013.01); *H01L 2224/16237* (2013.01); *H01L 2924/00014* (2013.01); *H01L 2924/01012* (2013.01); *H01L 2924/01029* (2013.01); *H01L 2924/04941* (2013.01); *H01L 2924/04953* (2013.01); *H01L 2924/1305* (2013.01); *H01L 2924/1306* (2013.01); *H01L 2924/13091* (2013.01); *H01L 2924/181* (2013.01); *H01L 2924/206* (2013.01); *H01L 2924/381* (2013.01)

(56) References Cited

U.S. PATENT DOCUMENTS

| | | | |
|---|---|---|---|
| 2010/0164098 A1* | 7/2010 | Kuechenmeister | H01L 24/16 257/737 |
| 2011/0283034 A1* | 11/2011 | Kang | H01L 24/14 710/305 |
| 2012/0007228 A1 | 1/2012 | Lu | |
| 2012/0007230 A1* | 1/2012 | Hwang | H01L 24/13 257/737 |
| 2013/0069231 A1 | 3/2013 | Shen | |

* cited by examiner

Fig. 7

SEMICONDUCTOR DEVICE AND PACKAGE ASSEMBLY INCLUDING THE SAME

PRIORITY CLAIM

The present application is a continuation of U.S. application Ser. No. 15/904,812, filed Feb. 26, 2018, which is a divisional of U.S. application Ser. No. 13/193,969, now U.S. Pat. No. 9,905,524, filed Jul. 29, 2011, which are incorporated herein by reference in their entirety.

TECHNICAL FIELD

This disclosure relates to the semiconductor devices and, more particularly, to bump structures in semiconductor devices and packaging assembly.

BACKGROUND

The semiconductor industry has experienced continued rapid growth due to continuous improvements in the integration density of various electronic components (i.e., transistors, diodes, resistors, capacitors, etc.). For the most part, this improvement in integration density has come from repeated reductions in minimum feature size, which allows more components to be integrated into a given area.

The past few decades have also seen many shifts in semiconductor packaging that have impacted the entire semiconductor industry. The introduction of surface-mount technology (SMT) and ball grid array (BGA) packages were generally important steps for high-throughput assembly of a wide variety of IC devices, while at the same time allowing for reduction of the pad pitch on the printed circuit board. Packaged ICs have a structure basically interconnected by fine gold wire between metal pads on the die and electrodes spreading out of molded resin packages. On the other hand, some chip scale packages (CSP) or BGA packages rely on bumps of solder to provide an electrical connection between contacts on the die and contacts on a substrate, such as a packaging substrate, a printed circuit board (PCB), another die/wafer, or the like. Other CSP or BGA packages utilize a solder ball or a metal bump placed onto a conductive pillar, relying on the soldered joint for structural integrity. The different layers making up the interconnection typically have different coefficients of thermal expansion (CTEs). As a result, a relatively large stress derived from this difference is exhibited on the joint area, which often causes cracks to form and propagate to low dielectric constant (low-k) dielectric layers or to the solder jointed area.

DETAILED DESCRIPTION

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure. Embodiments described herein relate to the use of bump structures for use with semiconductor devices. As will be discussed below, embodiments are disclosed that utilize a bump structure for the purpose of attaching one substrate to another substrate, wherein each substrate may be a die, wafer, interposer substrate, printed circuit board, packaging substrate, or the like, thereby allowing for die-to-die, wafer-to-die, wafer-to-wafer, die or wafer to interposer substrate or printed circuit board or packaging substrate, or the like. Throughout the various views and illustrative embodiments, like reference numerals are used to designate like elements.

Reference will now be made in detail to exemplary embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, an apparatus in accordance with the present disclosure. It is to be understood that elements not specifically shown or described may take various forms. Further, when a layer is referred to as being on another layer or "on" a substrate, it may be directly on the other layer or on the substrate, or intervening layers may also be present. Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

FIGS. 1-6 are cross-sectional views of illustrating various intermediate stages of a method of forming a semiconductor device having a bump structure in accordance with an exemplary embodiment.

Figure 1:
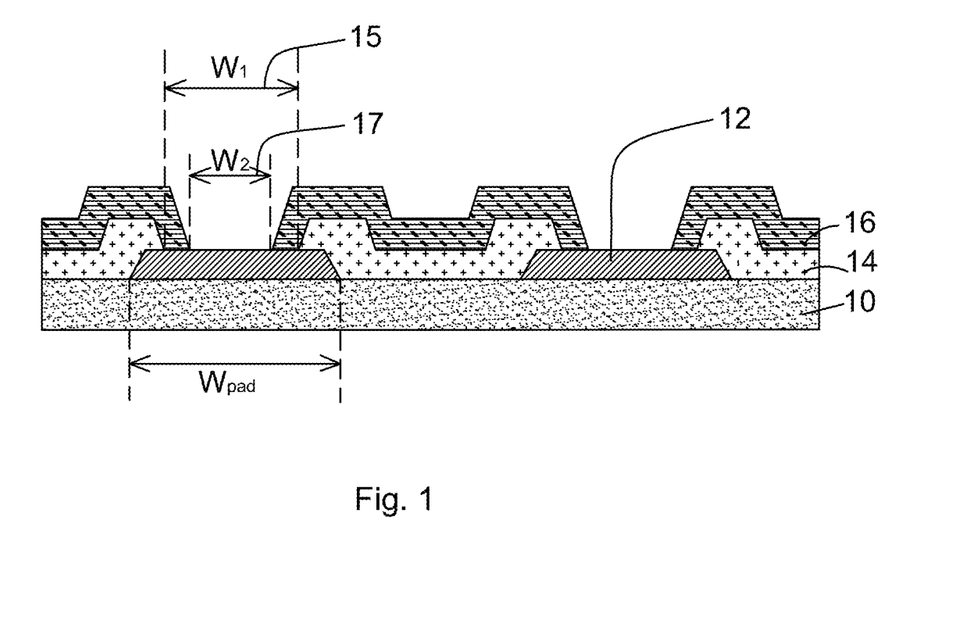
FIGS. 1-6 are cross-sectional views of illustrating various intermediate stages of a method of forming a semiconductor device having a bump structure in accordance with an exemplary embodiment.

With reference to FIG. 1, an example of a substrate 10 used for bump fabrication may comprise a semiconductor substrate as employed in a semiconductor integrated circuit fabrication, and integrated circuits may be formed therein and/or thereupon. The semiconductor substrate may be any construction comprising semiconductor materials, including, but not limited to, bulk silicon, a semiconductor wafer, a silicon-on-insulator (SOI) substrate, or a silicon germanium substrate. Other semiconductor materials including group III, group IV, and/or group V elements may also be used. The substrate 10 may further comprise a plurality of isolation features (not shown), such as shallow trench isolation (STI) features or local oxidation of silicon (LOCOS) features. The isolation features may isolate the various microelectronic elements (not shown). Examples of the various microelectronic elements that may be formed in the substrate 10 include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.); resistors; diodes; capacitors; inductors; fuses; and/or other suitable elements. Various processes are performed to form the various microelectronic elements including deposition, etching, implantation, photolithography, annealing, and/or other suitable processes. The microelectronic elements are interconnected to form the integrated circuit device, such as a logic device, memory device (e.g., SRAM), RF device, input/output (I/O) device, system-on-chip (SoC) device, combinations thereof, and/or other suitable types of devices.

The substrate 10 further includes inter-layer dielectric layers and a metallization structure overlying the integrated circuits. The inter-layer dielectric layers in the metallization structure include low-k dielectric materials, un-doped silicate glass (USG), silicon nitride, silicon oxynitride, or other materials. The dielectric constants (k value) of the low-k dielectric materials may be less than about 3.9, or less than about 2.8. Metal lines in the metallization structure may be formed of copper or copper alloys. One skilled in the art will be able to perform the formation of the metallization layers using applicable processes, and thus details for forming the metallization layer are omitted.

Any suitable process may be used to form the structures discussed above and will not be discussed in greater detail herein. As one of ordinary skill in the art will realize, the above description provides a general description of the features of the embodiment and that numerous other features may be present. For example, other circuitry, liners, barrier layers, interconnect metallization configurations, and the like, may be present. The above description is meant only to provide a context for embodiments discussed herein and is not meant to limit the disclosure or the scope of any claims to those specific embodiments.

As shown in FIG. 1, conductive pads 12 are formed and patterned in a top-level inter-layer dielectric layer, which is a portion of conductive routs. Each of the conductive pads 12 has a width $W_{pad}$. In one embodiment, the conductive pads 12 provide an electrical connection upon which a metal bump structure, such as a UBM structure, a copper pillar bump or a solder bump may be formed for external connections. The conductive pads 12 may be formed of any suitable conductive materials, such as copper (Cu), tungsten, aluminum (Al), AlCu alloys, silver, combinations thereof, or the like. In some embodiments, the conductive pads 12 may be a region or an end of a redistribution line to provide the desired pin or ball layout.

One or more passivation layers, such as passivation layer 14, are formed and patterned over the conductive pads 12 as illustrated in FIG. 1. In an embodiment, the passivation layer 14 has openings 15 exposing underlying portions of the conductive pads 12. Each the opening 15 has a width $W_1$, which is smaller than the width $W_{pad}$. In at least one embodiment, the passivation layer 14 is formed of a non-organic material such as un-doped silicate glass (USG), silicon nitride, silicon oxynitride, silicon oxide, or combinations thereof by any suitable method, such as CVD, PVD, or the like. In another embodiment, the passivation layer 14 is formed of a polymer layer, such as an epoxy, polyimide, benzocyclobutene (BCB), polybenzoxazole (PBO), or the like, although other relatively soft, often organic, dielectric materials can also be used. One of ordinary skill in the art will appreciate that a single layer of conductive pads and a passivation layer are shown for illustrative purposes only. As such, other embodiments may include any number of conductive pads and/or passivation layers.

FIG. 1 also illustrates a protective layer 16 formed and patterned over the passivation layer 14. In an embodiment, the protective layer 16 covers the passivation layer 14 and has openings 17 exposing underlying portions of the conductive pads 12. Each the opening 17 has a width $W_2$, which is smaller than the width $W_1$. For example, the width $W_2$ is presented by the following relationship: $W_2 < W_1 < W_{pad}$. The protective layer 16 may be formed of a polymer layer, such as an epoxy, polyimide, BCB, PBO, or the like, although other relatively soft, often organic, dielectric materials can also be used.

Figure 2:
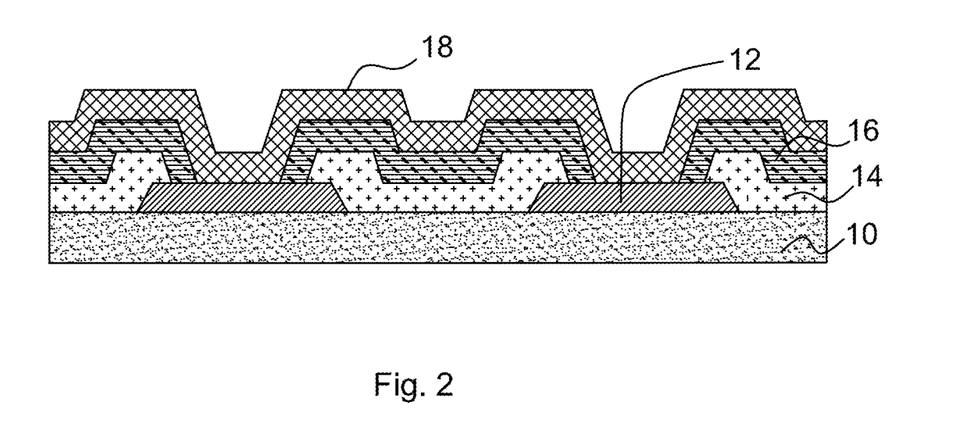

FIG. 2 shows the formation of an under-bump-metallurgy (UBM) layer 18 over the surfaces of the protective layer 16 and exposed portions of the conductive pads 12. In some embodiments, the UBM layer 18 includes a first UBM layer and a second UBM layer formed over the substrate 10. For example, the first UBM layer, also referred to as a diffusion barrier layer or a glue layer, is formed of titanium, tantalum, titanium nitride, tantalum nitride, or the like by physical vapor deposition (PVD) or sputtering. The first UBM layer is deposited to a thickness ranging from about 500 to 2000 Angstroms and, in some embodiments for example, to a thickness of about 1000 Angstroms. The second UBM layer is a copper seed layer formed on the first UBM layer by physical vapor deposition (PVD) or sputtering. The second UBM layer may be formed of copper alloys that include silver, chromium, nickel, tin, gold, or combinations thereof. The second UBM layer is deposited to a thickness ranging from about 500 to 10000 Angstroms and, in some embodiments for example, to a thickness of about 5000 Angstroms. In at least one embodiment, the UBM layer 18 includes a first UBM layer formed of Ti and a second UBM layer formed of Cu.

Figure 3:
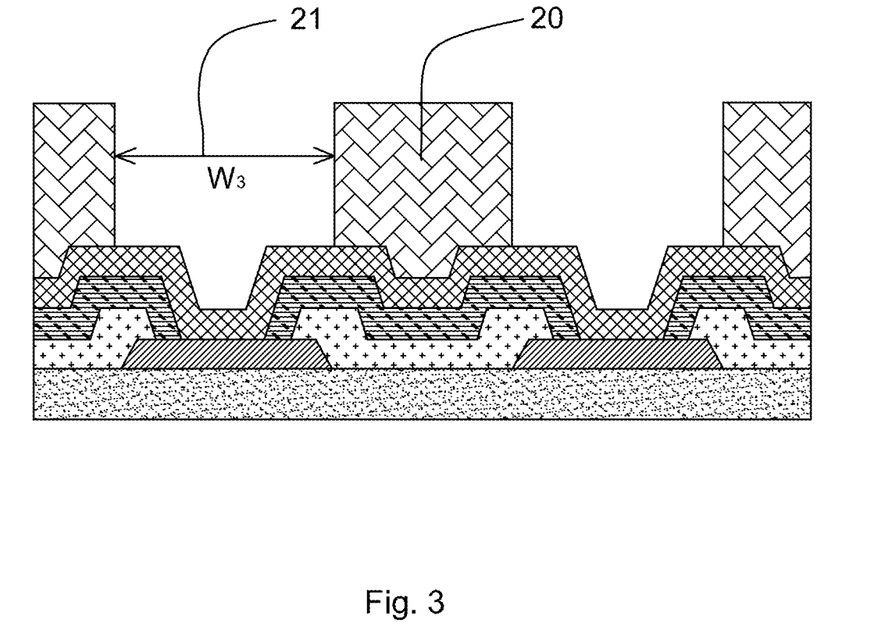

Next, in FIG. 3, a mask layer 20 is provided on the UBM layer 18 and patterned with openings 21 exposing portions of the UBM layer 18 for bump formation. The patterned mask layer 20 may decide the lateral boundaries of the metal bump to be subsequently formed as discussed in greater detail below. In one embodiment, the opening 21 of the mask layer 20 has a width $W_3$ greater than $W_{pad}$. The mask layer 20 is a dry film or a photoresist film used through the steps of coating, curing, descum and/or the like, followed by lithography techniques and/or etching processes such as a dry etch and/or a wet etch process.

Figure 4:
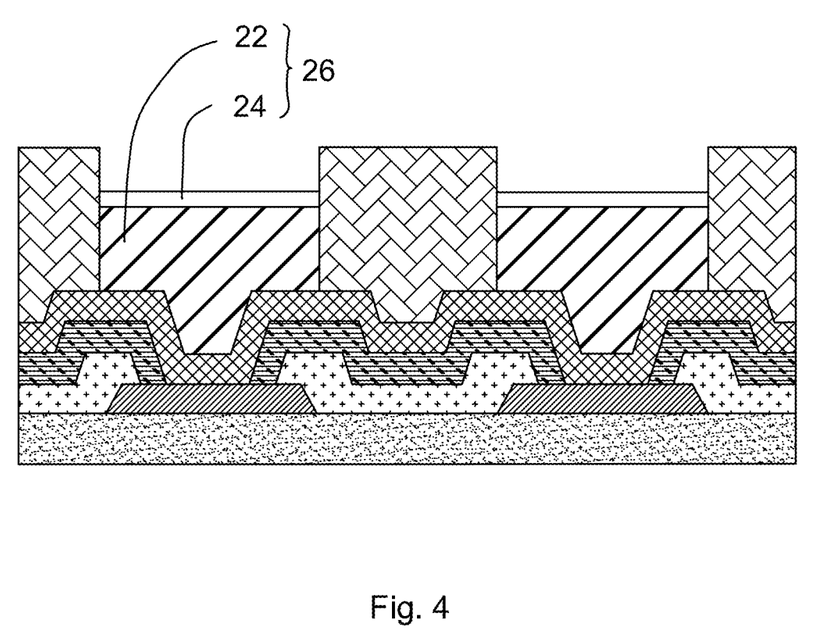

The openings 21 are then partially filled with a conductive material with solder wettability. With reference to FIG. 4, conductive pillars 26 are formed in the openings 21 to electrically contact the underlying UBM layer 18. In one embodiment, each the conductive pillar 26 includes a copper (Cu) layer 22. The Cu layer 22 is intended to include substantially a layer including pure elemental copper, copper containing unavoidable impurities, and/or copper alloys containing minor amounts of elements such as tantalum, indium, tin, zinc, manganese, chromium, titanium, germanium, strontium, platinum, magnesium, aluminum or zirconium. The formation methods may include sputtering, printing, electro plating, electroless plating, electrochemical deposition (ECD), molecular beam epitaxy (MBE), atomic layer deposition (ALD), and/or chemical vapor deposition (CVD) methods. For example, electro-chemical plating (ECP) is carried out to form the Cu layer 22. In an exemplary embodiment, the thickness of the Cu layer 22 is greater than 20 μm. In another exemplary embodiment, the thickness of the Cu layer 22 is greater than 40 μm. For example, the Cu layer 22 is of about 20-50 μm in thickness, or about 40-70 μm in thickness, although the thickness may be greater or smaller.

In some embodiments, each the conductive pillar 26 further includes an optional conductive cap layer 24 formed on top of the Cu layer 22 as illustrated in FIG. 4. The optional conductive cap layer 24 could act as a barrier layer to prevent copper in the Cu layer 22 from diffusing into a bonding material, such as solder alloy, that is used to bond the substrate 10 to external features. The prevention of copper diffusion increases the reliability and bonding strength of the electronics package. As described in greater detail below, solder material will be formed over the conductive pillar 26. During the soldering process, an intermetallic compound (IMC) layer (not shown) may be formed at the joint between the solder material and the underlying surface. It has been found that some materials may create a stronger, more durable IMC layer than others. The conductive cap layer 24 is a metallization layer which may include nickel, tin, tin-lead (SnPb), gold (Au), silver (Ag), palladium (Pd), Indium (In), platinum (Pt), nickel-palladium-gold (NiPdAu), nickel-gold (NiAu), other similar materials, or alloys. The conductive cap layer 24 may be a multi-layered structure or a single-layered structure. In at least one embodiment, the conductive cap layer 24 has a thickness about 1-5 μm.

Figure 5:
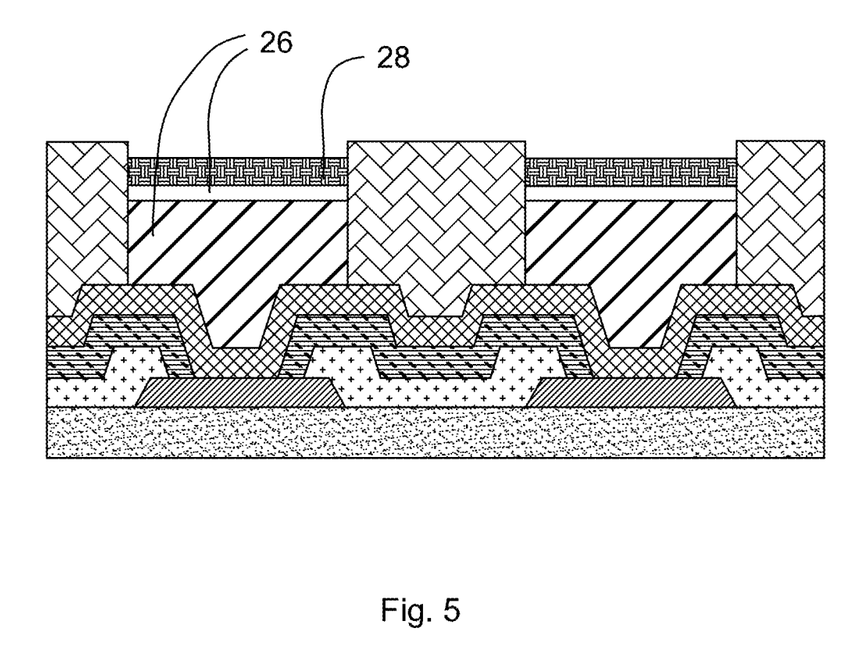

FIG. 5 illustrates solder layers 28 formed on the conductive pillars 26 within the openings 21 of the mask layer 20. The solder layer 28 may be made of Sn, SnAg, Sn—Pb, SnAgCu (with Cu weight percentage less than 0.3%), SnAgZn, SnZn, SnBi—In, Sn—In, Sn—Au, SnPb, SnCu, SnZnIn, or SnAgSb, etc. In at least one embodiment, the solder layer 28 is formed of a lead-free solder material layer.

Figure 6:
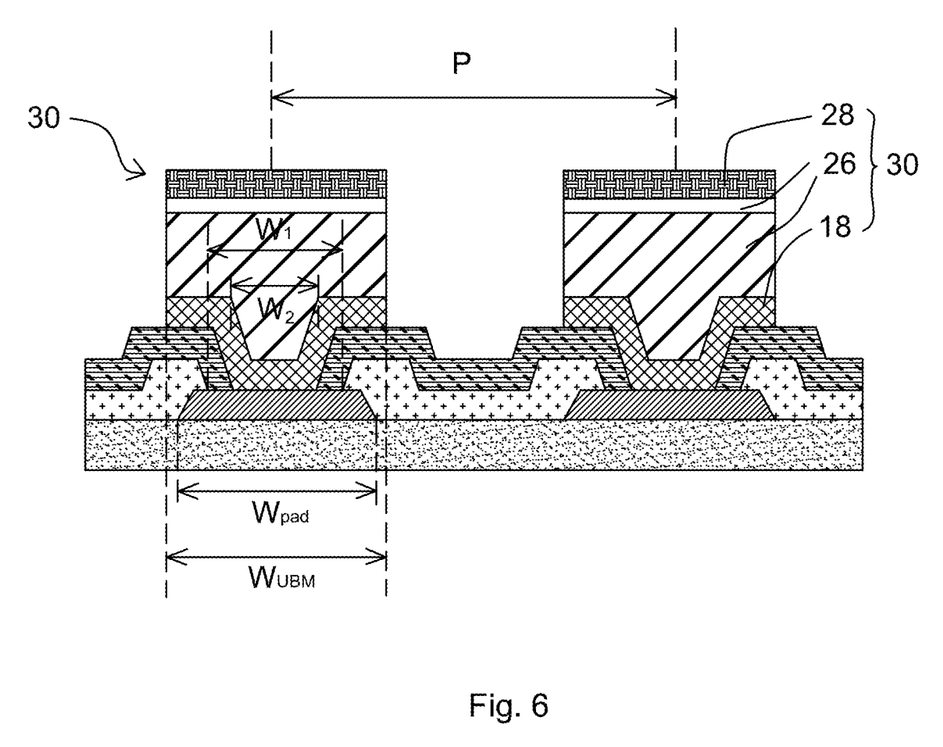

Referring to FIG. 6, the mask layer 20 is removed to expose portions of the UBM layer 18. In embodiments in which the mask layer 20 is formed from photoresist materials, the photoresist may be stripped by, for example, a chemical solution such as a mixture of ethyl lactate, anisole, methyl butyl acetate, amyl acetate, cresol novolak resin, and diazo photoactive compound, or another stripping process.

Thereafter, the exposed portions of the UBM layer 18 are etched back using the resulting structure (including layers 22, 24 and 28) as a mask by a wet and/or dry etching process, depending on the metallurgy of the UBM material. For example, a wet dip in a chemical solution of phosphoric acid (H$_3$PO$_4$) and hydrogen peroxide (H$_2$O$_2$), referred to as DPP, with 2% hydrofluoric (HF) acid, or another cleaning process, may be performed to remove exposed portions of the UBM layer 18 and any contaminants from the surface of the protective layer 18. The resulting UBM layer 18 has a width $W_{UBM}$, which is greater than $W_{pad}$. Thereafter, a solder reflow process and other back-end-of-line (BEOL) processing techniques suitable for the particular application may be performed.

The bump structures 30 are completed on the conductive pads 12 respectively. The bump structure 30 includes the UBM layer 18, the conductive pillar 26 and the solder layer 28. The bump structure 30 may exhibit any suitable UBM width ($W_{UBM}$) and conductive pillar height. The dimensions and characteristics of the bump structures 30 further include a bump pitch (P), which presents a distance between two adjacent bump structures 30. In the present embodiment, the bump pitch P is measured from the center of the two adjacent bump structures 30, however, other configurations are contemplated, for example, measuring the bump pitch from ends of the bump structures. It has been observed that bump structure dimensions/characteristics known to the inventors exhibit bump fatigue, particularly if the pad area is greater than the UBM area. Accordingly, the present embodiment exhibits dimensions/characteristics that provide improved surface profiles of the conductive pillar so as to increase joint reliability and reduce bump fatigue. For example, the pad width ($W_{pad}$) and bump pitch (P) are related to one another by the following relationship:

$$W_{pad}=(0.5\sim0.6)*P.$$

For example, the UBM width ($W_{UBM}$) and bump pitch (P) are related to one another by the following relationship:

$$W_{UBM}=(0.65\sim0.8)*P.$$

For example, the UBM width ($W_{UBM}$) and the pad width ($W_{pad}$) are related to one another by the following relationship:

$$W_{UBM}>1.1*W_{pad}$$

Ensuring that the package reliability is further improved, the opening width of passivation layer ($W_1$), the opening width of protective layer ($W_2$), and the bump pitch (P) may further be presented by the following relationship:

$$W_1=(0.3\sim0.4)*P;\text{ and/or}$$

$$W_2=(0.7\sim0.9)*W_1.$$

Contrary to the current trends in the industry, it has been found that if the UBM size is greater than the pad size, the top surface of the conductive pillar becomes smoother. The stress and cracking of the protective layer and/or the passivation layer may be reduced and/or eliminated.

After the bump formation, for example, an encapsulant may be formed, a singulation process may be performed to singulate individual dies, wafer-level or die-level stacking, and the like, may be performed. It should be noted, however, that embodiments may be used in many different situations. For example, embodiments may be used in a die-to-die bonding configuration, a die-to-wafer bonding configuration, a wafer-to-wafer bonding configuration, die-level packaging, wafer-level packaging, or the like.

Figure 7:
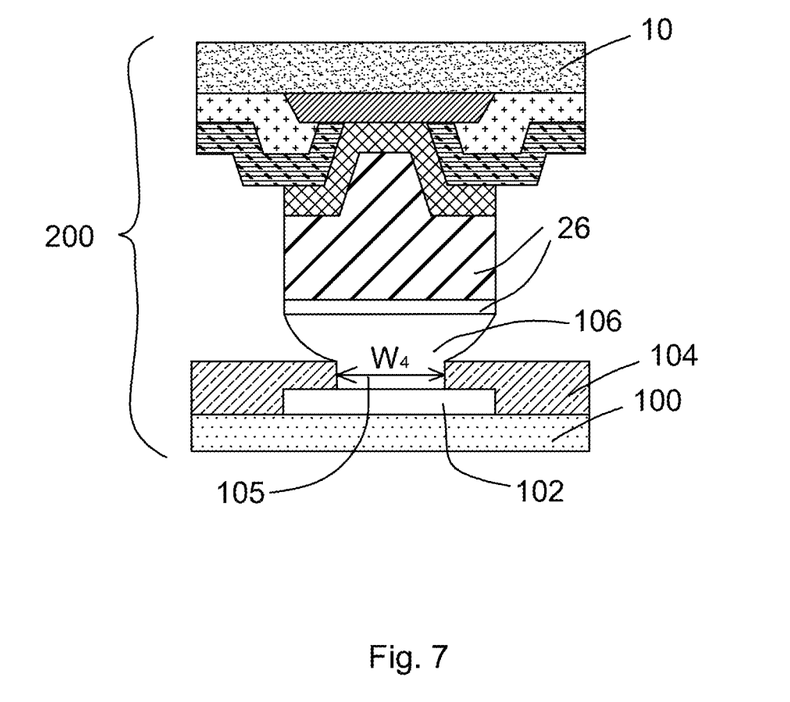
FIG. 7 is a cross-sectional view of a packaging assembly in accordance with an exemplary embodiment.

FIG. 7 is a cross-sectional diagram depicting an exemplary embodiment of a flip-chip assembly. The structure shown in FIG. 6 is flipped upside down and attached to another substrate 100 at the bottom of FIG. 7. The substrate 100 may be a package substrate, board (e.g., a printed circuit board (PCB)), a wafer, a die, an interposer substrate, or other suitable substrate. The bump structure 30 is coupled to the substrate 100 through various conductive attachment points. For example, a conductive region 102 is formed and patterned on the substrate 100. The conductive region 102 is a contact pad or a portion of a conductive trace, which is presented by a mask layer 104. In one embodiment, the mask layer 104 is a solder resist layer formed and patterned on the substrate 100 to expose the conductive region 102. The mask layer 104 has a mask opening 105, which provides a window for solder jointing. For example, a solder layer including alloys of tin, lead, silver, copper, nickel, bismuth, or combinations thereof may be provided on the conductive region 102. The substrate 10 can be coupled to the substrate 100 to form a joint solder structure 106 between the conductive pillar 26 and the conductive region 102. An exemplary coupling process includes a flux application, chip placement, reflowing of melting solder joints, and/or cleaning of flux residue. The integrated circuit substrate 10, the joint solder structure 106, and the other substrate 100 may be referred to as a packaging assembly 200, or in the present embodiment, a flip-chip packaging assembly. In at least one embodiment, the conductive region 102 is a conductive trace which overlaps the conductive pillar 26 and forms a bump-on-trace (BOT) interconnect.

Further geometric specifications include the UBM width (($W_{UBM}$) and the mask opening width ($W_4$) of the mask layer 104 related to one another by the following relationship:

$$W_4=(0.7\sim0.8)*W_{UBM}.$$

It should also be noted that other embodiments may not place the solder material on the conductive pillars 26 prior to attaching the substrate 10 to another substrate 100. In these other embodiments, the solder material may be placed on the other substrate and then the conductive pillars 26 on the substrate 10 are brought into contact with the solder material on the other substrate 100 and a reflow process is performed to solder the two substrates together.

In accordance with one aspect of the exemplary embodiments, a semiconductor device includes a first conductive pad and a second conductive pad, a first bump structure overlying and electrically coupled to the first conductive pad, and a second bump structure overlying and electrically coupled to the second conductive pad. A bump pitch exists from a center of the first bump to a center of the second bump. The first conductive pad has a first width. The first bump structure has a first under-bump metallization (UBM) layer with a second width, and the second width is greater than the first width. In some embodiments, a ratio between the second width and the bump pitch is presented by: second width=(0.65~0.8)*bump pitch. In some embodiments, a ratio between the first width and the bump pitch is presented by: first width=(0.5~0.6)*bump pitch. The semiconductor device may further include a passivation layer between the first conductive pad and the first UBM layer. The passivation layer has a first opening exposing a first portion of the first conductive pad. In some embodiments, a ratio between the width of the first opening and the bump pitch is presented by: width of first opening=(0.3~0.4)*bump pitch. The semiconductor device may further include a protective layer between the passivation layer and the UBM layer. The protective layer covers the passivation layer and has a second opening exposing a second portion of the first conductive pad. In some embodiments, a ratio between the width of the second opening and the width of the first opening is presented by: width of second opening=(0.7~0.9) *width of first opening. At least one of the first bump and the second bump may include a copper pillar on the first UBM layer, and an optional metal cap layer overlying the copper pillar. At least one of the first bump and the second bump may include a solder layer overlying the copper pillar.

In accordance with another aspect of the exemplary embodiments, a packaging assembly includes a semiconductor device joined to a substrate. The semiconductor device includes a conductive pad, an under-bump metallization (UBM) layer on the conductive pad, and a conductive pillar on the UBM layer. The substrate includes a conductive region, and a mask layer overlying the substrate and exposing a portion of the conductive region. A joint solder structure is formed between the conductive pillar of the semiconductor device and the conductive region of the substrate. The conductive pad has a first width, and the UBM layer has a second width greater than the first width. In one embodiment, the mask layer has a mask opening exposing a portion of the conductive region, and the width of the mask opening is smaller than the second width. In some embodiments, a ratio between the width of the mask opening and the second width is presented by: width of mask opening= (0.7~0.8)*second width. In at least one embodiment, the conductive pillar comprises a copper pillar, and the conductive region is a copper trace. In one embodiment, the mask layer is a solder resist layer.

In accordance with the other aspect of the exemplary embodiments, a semiconductor device includes a semiconductor substrate, a conductive pad having a first width, a protective layer overlying the semiconductor substrate and exposing a portion of the conductive pad, an under-bump metallization (UBM) layer overlying the protective layer and electrically coupled to the conductive pad, and a conductive pillar overlying the UBM layer. The UBM layer has a second width greater than the first width. In some embodiments, the first width and second width are related to one another by the following relationship: second width>1.2*first width. In some embodiments, the first width and second width are related to one another by the following relationship: second width>1.3*first width. In one embodiment, the conductive pillar includes a copper pillar and an optional metal cap layer.

An aspect of this description relates to a semiconductor device. The semiconductor device includes a conductive pad having a first width. The semiconductor device includes a passivation layer over the conductive pad, wherein the passivation layer directly contacts the conductive pad. The semiconductor device includes a protective layer over the passivation layer, wherein the protective layer directly contacts the conductive pad. The semiconductor device includes an under-bump metallization (UBM) layer directly contacting the conductive pad, wherein the UBM layer has a second width greater than the first width. The semiconductor device includes a conductive pillar on the UBM layer. In some embodiments, the semiconductor device further includes a cap layer over the conductive pillar, wherein the cap layer exposes sidewalls of the UBM layer. In some embodiments, the second width is at least 10% greater than the first width. In some embodiments, the passivation layer directly contacts a sidewall of the conductive pad. In some embodiments, the protective layer directly contacts a top surface of the conductive pad. In some embodiments, the semiconductor device further includes a solder layer over the conductive pillar. In some embodiments, the protective layer separates the UBM layer from the passivation layer. In some embodiments, the conductive pillar has a non-uniform thickness.

An aspect of this description relates to a packaging assembly. The package assembly includes a semiconductor device. The semiconductor device includes a conductive pad having a first width, a conductive pillar over the conductive pad, wherein the conductive pillar has a second width, and a cap layer over the conductive pillar. The package assembly includes a substrate. The substrate includes a conductive region, and a mask layer over the conductive region, wherein the mask layer defines an opening exposing a portion of the conductive region. The package assembly further includes a joint structure electrically connecting the conductive pillar and the conductive region, wherein the joint structure extends through the opening. In some embodiments, the second width is greater than the first width. In some embodiments, the cap layer exposes sidewalls of the conductive pillar layer. In some embodiments, the semiconductor device further includes a protective layer over the conductive pad, and the protective layer directly contacts the conductive pad. In some embodiments, the UBM layer directly contacts the conductive pad. In some embodiments, the opening has a third width less than the first width. In some embodiments, a ratio between the third width and the second width ranges from about 0.7 to about 0.8. In some embodiments, the joint structure comprises a solder layer.

An aspect of this description relates to a semiconductor device. The semiconductor device includes a plurality of conductive pads, wherein each conductive pad of the plurality of conductive pads has a first width. The semiconductor device further includes a passivation layer over each of the plurality of conductive pads, wherein the passivation layer directly contacts each of the plurality of conductive pads. The semiconductor device further includes a protective layer over the passivation layer, wherein the protective layer directly contacts each of the plurality of conductive pads. The semiconductor device further includes a plurality of under-bump metallization (UBM) layers, wherein each UBM layer of the plurality of UBM layers directly contacting a corresponding conductive pad of the plurality of conductive pads, and each of the plurality of UBM layers has a second width greater than the first width. The semiconductor device further includes a plurality of conductive pillars, wherein each conductive pillar of the plurality of conductive pillars is on a corresponding UBM layer of the plurality of UBM layers, and adjacent conductive pillars of the plurality of conductive pillars are separated by a pitch. In some embodiments, a ratio between the first width and the pitch ranges from about 0.5 to about 0.6. In some embodiments, a ratio between the second width and the pitch ranges from about 0.65 to about 0.8. In some embodiments, a ratio between the second width and the first width is greater than 1.1.

In the preceding detailed description, the disclosure is described with reference to specific exemplary embodiments thereof. It will, however, be evident that various modifications, structures, processes, and changes may be made thereto without departing from the broader spirit and scope of the disclosure. The specification and drawings are, accordingly, to be regarded as illustrative and not restrictive. It is understood that the disclosure is capable of using various other combinations and environments and is capable of changes or modifications within the scope of inventive concepts as expressed herein.

What is claimed is:

1. A semiconductor device comprising:
   a conductive pad having a first width;
   a passivation layer over the conductive pad, wherein the passivation layer directly contacts the conductive pad;
   a protective layer over the passivation layer, wherein the protective layer directly contacts the conductive pad;
   an under-bump metallization (UBM) layer directly contacting the conductive pad, wherein the UBM layer has a second width greater than the first width; and
   a conductive pillar on the UBM layer, wherein a maximum width of the conductive pillar is the second width; and
   a cap layer over the conductive pillar, wherein a maximum width of the cap layer is the second width.

2. The semiconductor device of claim 1, wherein the cap layer exposes sidewalls of the UBM layer.

3. The semiconductor device of claim 1, wherein the second width is at least 10% greater than the first width.

4. The semiconductor device of claim 1, wherein the passivation layer directly contacts a sidewall of the conductive pad.

5. The semiconductor device of claim 1, wherein the protective layer directly contacts a top surface of the conductive pad.

6. The semiconductor device of claim 1, further comprising a solder layer over the conductive pillar.

7. The semiconductor device of claim 1, wherein the protective layer separates the UBM layer from the passivation layer.

8. The semiconductor device of claim 1, wherein the conductive pillar has a non-uniform thickness.

9. A packaging assembly, comprising:
   a semiconductor device, wherein the semiconductor device comprises:
      a conductive pad having a first width,
      a conductive pillar over the conductive pad, wherein the conductive pillar has a second width, and
      a cap layer over the conductive pillar;
   a substrate, wherein the substrate comprises:
      a conductive region, and
      a mask layer over the conductive region, wherein the mask layer defines an opening exposing a portion of the conductive region; and
   a joint structure electrically connecting the conductive pillar and the conductive region, wherein the joint structure extends through the opening.

10. The packaging assembly of claim 9, wherein the second width is greater than the first width.

11. The packaging assembly of claim 9, wherein the cap layer exposes sidewalls of the conductive pillar.

12. The packaging assembly of claim 9, wherein the semiconductor device further comprises a protective layer over the conductive pad, and the protective layer directly contacts the conductive pad.

13. The packaging assembly of claim 9, further comprising an under bump metallurgy (UBM) layer, wherein the UBM layer directly contacts the conductive pad.

14. The packaging assembly of claim 9, wherein the opening has a third width less than the first width.

15. The packaging assembly of claim 14, wherein a ratio between the third width and the second width ranges from about 0.7 to about 0.8.

16. The packaging assembly of claim 9, wherein the joint structure comprises a solder layer.

17. A semiconductor device comprising:
   a plurality of conductive pads, wherein each conductive pad of the plurality of conductive pads has a first width;
   a passivation layer over each of the plurality of conductive pads, wherein the passivation layer directly contacts each of the plurality of conductive pads;
   a protective layer over the passivation layer, wherein the protective layer directly contacts each of the plurality of conductive pads;
   a plurality of under-bump metallization (UBM) layers, wherein each UBM layer of the plurality of UBM layers directly contacting a corresponding conductive pad of the plurality of conductive pads, and each of the plurality of UBM layers has a second width greater than the first width; and
   a plurality of conductive pillars, wherein each conductive pillar of the plurality of conductive pillars is on a corresponding UBM layer of the plurality of UBM layers, and adjacent conductive pillars of the plurality of conductive pillars are separated by a pitch.

18. The semiconductor device of claim 17, wherein a ratio between the first width and the pitch ranges from about 0.5 to about 0.6.

19. The semiconductor device of claim 17, wherein a ratio between the second width and the pitch ranges from about 0.65 to about 0.8.

20. The semiconductor device of claim 17, wherein a ratio between the second width and the first width is greater than 1.1.

* * * * *